US011342163B2

(12) United States Patent
Angelov et al.

(10) Patent No.: US 11,342,163 B2
(45) Date of Patent: May 24, 2022

(54) VARIABLE DEPTH EDGE RING FOR ETCH UNIFORMITY CONTROL

(71) Applicant: LAM RESEARCH CORPORATION, Fremont, CA (US)

(72) Inventors: Ivelin Angelov, San Jose, CA (US); Cristian Siladie, Castro Valley, CA (US); Dean Larson, Pleasanton, CA (US); Brian Severson, Queen Creek, AZ (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/871,829

(22) Filed: May 11, 2020

(65) Prior Publication Data

US 2020/0273671 A1    Aug. 27, 2020

Related U.S. Application Data

(62) Division of application No. 15/422,823, filed on Feb. 2, 2017, now Pat. No. 10,651,015.

(Continued)

(51) Int. Cl.
*H01J 37/00* (2006.01)
*H01J 37/32* (2006.01)

(52) U.S. Cl.
CPC .......... *H01J 37/3244* (2013.01); *H01J 37/00* (2013.01); *H01J 37/32082* (2013.01); *H01J 37/32715* (2013.01); *H01J 2237/334* (2013.01)

(58) Field of Classification Search
CPC ............. H01J 37/3244; H01J 37/32715; H01J 37/32082; H01J 2237/334
See application file for complete search history.

(56) References Cited

U.S. PATENT DOCUMENTS 3,534,753 A   10/1970  Ollivier
4,262,686 A    4/1981  Heim et al.
(Continued)

FOREIGN PATENT DOCUMENTS

CN    1189859 A     8/1998
CN    1701421 A    11/2005
(Continued)

OTHER PUBLICATIONS

First Office Action corresponding to Tiawanese Application No. 106104190, dated Sep. 4, 2020, 5 pages.
(Continued)

*Primary Examiner* — Rick K Chang

(57) ABSTRACT

A method of operating a substrate support includes arranging a substrate on an inner portion of the substrate support and calculating a desired pocket depth of the substrate support using data indicative of a relationship between the desired pocket depth and at least one process parameter. The desired pocket depth corresponds to a desired distance between an upper surface of an edge ring surrounding the inner portion and an upper surface of the substrate. The method further includes selectively controlling, based on the desired pocket depth as calculated, an actuator to raise and lower at least one of the edge ring and the inner portion to adjust the distance between the upper surface of the edge ring and the upper surface of the substrate.

10 Claims, 11 Drawing Sheets

Related U.S. Application Data

(60) Provisional application No. 62/294,593, filed on Feb. 12, 2016.

(56) References Cited

U.S. PATENT DOCUMENTS

| | | |
|---|---|---|
| 4,374,698 A | 2/1983 | Sanders et al. |
| 4,431,477 A | 2/1984 | Zajac |
| 4,793,897 A | 12/1988 | Dunfield et al. |
| 5,220,515 A | 6/1993 | Freerks et al. |
| 5,329,965 A | 7/1994 | Gordon |
| 5,346,578 A | 9/1994 | Benzing et al. |
| 5,413,145 A | 5/1995 | Rhyne et al. |
| 5,520,969 A | 5/1996 | Nishizato et al. |
| 5,605,179 A | 2/1997 | Strong, Jr. et al. |
| 5,660,673 A | 8/1997 | Miyoshi |
| 5,662,143 A | 9/1997 | Caughran |
| 5,683,517 A | 11/1997 | Shan |
| 5,702,530 A | 12/1997 | Shan et al. |
| 5,744,695 A | 4/1998 | Forbes |
| 5,762,714 A | 6/1998 | Mohn et al. |
| 5,792,272 A | 8/1998 | van Os et al. |
| 5,907,221 A | 5/1999 | Sato et al. |
| 6,022,809 A | 2/2000 | Fan |
| 6,042,687 A | 3/2000 | Singh et al. |
| 6,044,534 A | 4/2000 | Seo et al. |
| 6,050,283 A | 4/2000 | Hoffman et al. |
| 6,060,400 A | 5/2000 | Oehrlein et al. |
| 6,062,256 A | 5/2000 | Miller et al. |
| 6,074,959 A | 6/2000 | Wang et al. |
| 6,152,168 A | 11/2000 | Ohmi et al. |
| 6,206,976 B1 | 3/2001 | Crevasse et al. |
| 6,210,593 B1 | 4/2001 | Ohkuni et al. |
| 6,217,937 B1 | 4/2001 | Shealy |
| 6,294,466 B1 | 9/2001 | Chang |
| 6,328,808 B1 | 12/2001 | Tsai et al. |
| 6,376,386 B1 | 4/2002 | Oshima |
| 6,492,774 B1 | 12/2002 | Han et al. |
| 6,589,352 B1 | 7/2003 | Yudovsky et al. |
| 6,709,547 B1 | 3/2004 | Ni et al. |
| 6,736,931 B2 | 5/2004 | Collins et al. |
| 6,744,212 B2 | 6/2004 | Fischer et al. |
| 6,818,560 B1 | 11/2004 | Koshimizu et al. |
| 6,841,943 B2 | 1/2005 | Vahedi et al. |
| 6,896,765 B2 | 5/2005 | Steger |
| 6,898,558 B2 | 5/2005 | Klekotka |
| 6,962,879 B2 | 11/2005 | Zhu et al. |
| 7,129,171 B2 | 10/2006 | Zhu et al. |
| 7,288,482 B2 | 10/2007 | Panda et al. |
| 7,309,646 B1 | 12/2007 | Heo et al. |
| 7,311,784 B2 | 12/2007 | Fink |
| 7,338,907 B2 | 3/2008 | Li et al. |
| 7,481,944 B2 | 1/2009 | Nozawa et al. |
| 7,736,998 B2 | 6/2010 | Morita et al. |
| 7,757,541 B1 | 7/2010 | Monkowski et al. |
| 7,758,698 B2 | 7/2010 | Bang et al. |
| 7,882,800 B2 | 2/2011 | Koshiishi et al. |
| 7,968,469 B2 | 6/2011 | Collins et al. |
| 7,988,813 B2 | 8/2011 | Chen et al. |
| 8,137,463 B2 | 3/2012 | Liu et al. |
| 8,291,935 B1 | 10/2012 | Merritt et al. |
| 8,552,334 B2 | 10/2013 | Tappan et al. |
| 8,555,920 B2 | 10/2013 | Hirata et al. |
| 8,592,328 B2 | 11/2013 | Hausmann et al. |
| 8,889,024 B2 | 11/2014 | Watanabe et al. |
| 8,956,980 B1 | 2/2015 | Chen et al. |
| 8,999,106 B2 | 4/2015 | Liu et al. |
| 9,011,637 B2 | 4/2015 | Yamamoto |
| 9,051,647 B2 | 6/2015 | Cooperberg et al. |
| 9,059,678 B2 | 6/2015 | Long et al. |
| 9,142,391 B2 | 9/2015 | Yamamoto |
| 9,318,343 B2 | 4/2016 | Ranjan et al. |
| 9,471,065 B2 | 10/2016 | Koyomogi et al. |
| 9,472,443 B2 * | 10/2016 | Rasheed ............ H01J 37/32651 |
| 9,583,355 B2 * | 2/2017 | Nishizaki ............ H01L 21/3065 |
| 9,593,419 B2 * | 3/2017 | Balasubramanian ....................... C23C 16/4584 |
| 9,640,409 B1 | 5/2017 | Yang et al. |
| 10,090,161 B2 * | 10/2018 | Doba ................ H01J 37/32082 |
| 10,170,277 B2 * | 1/2019 | Singh ................ H01J 37/32477 |
| 10,242,848 B2 * | 3/2019 | Jeon ................ H01J 37/32715 |
| 10,410,832 B2 | 9/2019 | Zhang et al. |
| 10,504,738 B2 | 12/2019 | Lin et al. |
| 10,510,516 B2 | 12/2019 | Lin et al. |
| 10,591,934 B2 | 3/2020 | Gopalakrishnan et al. |
| 10,651,015 B2 | 5/2020 | Angelov et al. |
| 10,699,878 B2 | 6/2020 | Caron et al. |
| 2001/0002581 A1 | 6/2001 | Nishikawa et al. |
| 2001/0004903 A1 | 6/2001 | Ohmi et al. |
| 2001/0013363 A1 | 8/2001 | Kitayama et al. |
| 2001/0035530 A1 | 11/2001 | Udagawa |
| 2002/0038669 A1 | 4/2002 | Yamagishi et al. |
| 2002/0042205 A1 | 4/2002 | McMillin et al. |
| 2002/0045265 A1 | 4/2002 | Bergh et al. |
| 2002/0046991 A1 | 4/2002 | Smith et al. |
| 2002/0048536 A1 | 4/2002 | Bergh et al. |
| 2002/0071128 A1 | 6/2002 | Doan |
| 2002/0072240 A1 | 6/2002 | Koike |
| 2002/0088542 A1 | 7/2002 | Nishikawa et al. |
| 2002/0160125 A1 | 10/2002 | Johnson et al. |
| 2002/0174905 A1 | 11/2002 | Latino et al. |
| 2002/0175144 A1 | 11/2002 | Hung et al. |
| 2003/0000369 A1 | 1/2003 | Funaki |
| 2003/0003696 A1 | 1/2003 | Gelatos et al. |
| 2003/0011619 A1 | 1/2003 | Jacobs et al. |
| 2003/0013080 A1 | 1/2003 | Luebke et al. |
| 2003/0021356 A1 | 1/2003 | Okuda et al. |
| 2003/0023023 A1 | 1/2003 | Harris et al. |
| 2003/0116195 A1 | 6/2003 | Weissgerber et al. |
| 2003/0130807 A1 | 7/2003 | Ambrosina et al. |
| 2003/0201069 A1 | 10/2003 | Johnson |
| 2003/0213560 A1 | 11/2003 | Wang et al. |
| 2003/0230239 A1 | 12/2003 | Shan |
| 2003/0236592 A1 | 12/2003 | Shajii et al. |
| 2003/0236638 A1 | 12/2003 | Shajii et al. |
| 2003/0236643 A1 | 12/2003 | Shajii et al. |
| 2004/0007176 A1 | 1/2004 | Janakiraman et al. |
| 2004/0025060 A1 | 2/2004 | Raffaele et al. |
| 2004/0026149 A1 | 2/2004 | Wilkinson |
| 2004/0031338 A1 | 2/2004 | Chen et al. |
| 2004/0053428 A1 | 3/2004 | Steger |
| 2004/0060595 A1 | 4/2004 | Chittenden |
| 2004/0089240 A1 | 5/2004 | Dando et al. |
| 2004/0094206 A1 | 5/2004 | Ishida |
| 2004/0112538 A1 | 6/2004 | Larson et al. |
| 2004/0112539 A1 | 6/2004 | Larson et al. |
| 2004/0112540 A1 | 6/2004 | Larson et al. |
| 2004/0149389 A1 | 8/2004 | Fink |
| 2004/0163601 A1 | 8/2004 | Kadotani et al. |
| 2004/0168719 A1 | 9/2004 | Nambu |
| 2004/0173270 A1 | 9/2004 | Harris et al. |
| 2004/0200529 A1 | 10/2004 | Lull et al. |
| 2004/0250600 A1 | 12/2004 | Bevers et al. |
| 2004/0261492 A1 | 12/2004 | Zarkar et al. |
| 2005/0005994 A1 | 1/2005 | Sugiyama et al. |
| 2005/0041238 A1 | 2/2005 | Ludviksson et al. |
| 2005/0067021 A1 | 3/2005 | Bevers et al. |
| 2005/0082007 A1 | 4/2005 | Nguyen et al. |
| 2005/0155625 A1 | 7/2005 | Jangjian et al. |
| 2005/0199342 A1 | 9/2005 | Shajii et al. |
| 2005/0241763 A1 | 11/2005 | Huang et al. |
| 2006/0011237 A1 | 1/2006 | Tison et al. |
| 2006/0021223 A1 | 2/2006 | Wakayama et al. |
| 2006/0060141 A1 | 3/2006 | Kamaishi et al. |
| 2006/0090706 A1 * | 5/2006 | Miller ............... H01L 21/68735 118/728 |
| 2006/0090797 A1 | 5/2006 | Olander |
| 2006/0097644 A1 | 5/2006 | Kono et al. |
| 2006/0124169 A1 | 6/2006 | Mizusawa et al. |
| 2006/0207595 A1 | 9/2006 | Ohmi et al. |
| 2006/0212233 A1 | 9/2006 | Wong et al. |
| 2006/0237063 A1 | 10/2006 | Ding et al. |
| 2007/0024077 A1 | 2/2007 | McClintock |
| 2007/0026684 A1 | 2/2007 | Parascandola et al. |

(56) References Cited

U.S. PATENT DOCUMENTS

| | | |
|---|---|---|
| 2007/0066038 A1 | 3/2007 | Sadjadi et al. |
| 2007/0158025 A1 | 7/2007 | Larson |
| 2007/0175391 A1 | 8/2007 | Mizusawa |
| 2007/0187363 A1 | 8/2007 | Oka et al. |
| 2007/0204797 A1 | 9/2007 | Fischer |
| 2007/0204914 A1 | 9/2007 | Kurosawa et al. |
| 2007/0233412 A1 | 10/2007 | Gotoh et al. |
| 2007/0240778 A1 | 10/2007 | L'Bassi et al. |
| 2007/0256785 A1 | 11/2007 | Pamarthy et al. |
| 2007/0256786 A1 | 11/2007 | Zhou et al. |
| 2007/0259112 A1 | 11/2007 | Ishikawa et al. |
| 2007/0283884 A1* | 12/2007 | Tiller ............... C23C 14/564 118/715 |
| 2008/0101978 A1 | 5/2008 | Ryabova et al. |
| 2008/0115834 A1 | 5/2008 | Geoffrion et al. |
| 2008/0121177 A1 | 5/2008 | Bang et al. |
| 2008/0121178 A1 | 5/2008 | Bang et al. |
| 2008/0202588 A1 | 8/2008 | Gold et al. |
| 2008/0202609 A1 | 8/2008 | Gold et al. |
| 2008/0202610 A1 | 8/2008 | Gold et al. |
| 2008/0223873 A1 | 9/2008 | Chen et al. |
| 2008/0236749 A1 | 10/2008 | Koshimizu et al. |
| 2009/0015141 A1 | 1/2009 | Wang et al. |
| 2009/0056629 A1 | 3/2009 | Katz et al. |
| 2009/0061083 A1 | 3/2009 | Chiang et al. |
| 2009/0061640 A1 | 3/2009 | Wong et al. |
| 2009/0061644 A1 | 3/2009 | Chiang et al. |
| 2009/0067954 A1 | 3/2009 | Lanee et al. |
| 2009/0090174 A1 | 4/2009 | Paul et al. |
| 2009/0095364 A1 | 4/2009 | Itoh et al. |
| 2009/0151419 A1 | 6/2009 | Doniat et al. |
| 2009/0162952 A1 | 6/2009 | Liu et al. |
| 2009/0183548 A1 | 7/2009 | Monkowski et al. |
| 2009/0183549 A1 | 7/2009 | Monkowski et al. |
| 2009/0197423 A1 | 8/2009 | Koshimizu et al. |
| 2009/0209112 A1 | 8/2009 | Koelmel et al. |
| 2009/0221117 A1 | 9/2009 | Tan et al. |
| 2009/0236313 A1 | 9/2009 | Qiu et al. |
| 2009/0255901 A1* | 10/2009 | Okita ............... F27D 5/0068 216/67 |
| 2009/0272717 A1 | 11/2009 | Pamarthy et al. |
| 2009/0320754 A1 | 12/2009 | Oya et al. |
| 2010/0003824 A1* | 1/2010 | Kadkhodayan ... H01J 37/32541 438/710 |
| 2010/0012310 A1 | 1/2010 | Christensen et al. |
| 2010/0025369 A1 | 2/2010 | Negishi et al. |
| 2010/0030390 A1 | 2/2010 | Yamaguchi et al. |
| 2010/0071438 A1 | 3/2010 | Davis et al. |
| 2010/0122655 A1 | 5/2010 | Tiner et al. |
| 2010/0144539 A1 | 6/2010 | Bergh et al. |
| 2010/0145633 A1 | 6/2010 | Yasuda |
| 2010/0178770 A1 | 7/2010 | Zin |
| 2010/0216313 A1 | 8/2010 | Iwai |
| 2010/0229976 A1 | 9/2010 | Hirata et al. |
| 2010/0264117 A1 | 10/2010 | Ohmi et al. |
| 2010/0269924 A1 | 10/2010 | Yasuda |
| 2011/0019332 A1 | 1/2011 | Chistyakov |
| 2011/0025322 A1 | 2/2011 | Yamazaki et al. |
| 2011/0026588 A1 | 2/2011 | Boyce |
| 2011/0026595 A1 | 2/2011 | Yasuda et al. |
| 2011/0031111 A1 | 2/2011 | Kobayashi |
| 2011/0094596 A1 | 4/2011 | Sugiyama et al. |
| 2011/0135821 A1 | 6/2011 | Ding |
| 2011/0157760 A1 | 6/2011 | Willwerth et al. |
| 2011/0253225 A1 | 10/2011 | Beeby et al. |
| 2011/0265883 A1 | 11/2011 | Cruse et al. |
| 2011/0265951 A1 | 11/2011 | Xu et al. |
| 2011/0287631 A1 | 11/2011 | Yamamoto |
| 2011/0303696 A1 | 12/2011 | Kelekar et al. |
| 2012/0031500 A1 | 2/2012 | Hirose et al. |
| 2012/0034786 A1 | 2/2012 | Dhindsa et al. |
| 2012/0097266 A1 | 4/2012 | Cobb et al. |
| 2012/0149213 A1 | 6/2012 | Nittala et al. |
| 2012/0152364 A1 | 6/2012 | Hashimoto et al. |
| 2012/0156363 A1 | 6/2012 | Quinn et al. |
| 2012/0174990 A1 | 7/2012 | Yasuda |
| 2012/0190208 A1 | 7/2012 | Ozu et al. |
| 2012/0238102 A1 | 9/2012 | Zhang et al. |
| 2012/0238103 A1 | 9/2012 | Zhang et al. |
| 2012/0244715 A1 | 9/2012 | Lebouitz et al. |
| 2012/0247386 A1 | 10/2012 | Sanchez et al. |
| 2012/0289057 A1 | 11/2012 | DeDontney |
| 2012/0298221 A1 | 11/2012 | Takeuchi et al. |
| 2012/0305184 A1 | 12/2012 | Singh et al. |
| 2012/0328780 A1 | 12/2012 | Yamagishi |
| 2013/0000731 A1 | 1/2013 | Singh et al. |
| 2013/0008607 A1 | 1/2013 | Matsumoto et al. |
| 2013/0025715 A1 | 1/2013 | Yamaguchi et al. |
| 2013/0029494 A1 | 1/2013 | Sasaki et al. |
| 2013/0029496 A1 | 1/2013 | Bauer et al. |
| 2013/0045605 A1 | 2/2013 | Wang et al. |
| 2013/0085618 A1 | 4/2013 | Ding |
| 2013/0104996 A1 | 5/2013 | Oh et al. |
| 2013/0106286 A1 | 5/2013 | Banna et al. |
| 2013/0131300 A1 | 5/2013 | Olmscheid et al. |
| 2013/0145816 A1 | 6/2013 | Lowe |
| 2013/0157388 A1 | 6/2013 | Grimbergen |
| 2013/0220433 A1 | 8/2013 | Sawada et al. |
| 2013/0255784 A1 | 10/2013 | Ye et al. |
| 2013/0270997 A1 | 10/2013 | Zhao et al. |
| 2013/0288477 A1* | 10/2013 | Rieschl ............... C23C 16/4585 438/680 |
| 2014/0020764 A1 | 1/2014 | Woelk et al. |
| 2014/0033828 A1 | 2/2014 | Larson et al. |
| 2014/0080308 A1 | 3/2014 | Chen et al. |
| 2014/0094039 A1 | 4/2014 | Ranish et al. |
| 2014/0120737 A1 | 5/2014 | Swaminathan et al. |
| 2014/0141621 A1 | 5/2014 | Ren et al. |
| 2014/0144471 A1 | 5/2014 | Kahlon et al. |
| 2014/0182689 A1 | 7/2014 | Shareef et al. |
| 2014/0213055 A1 | 7/2014 | Himori et al. |
| 2014/0248780 A1 | 9/2014 | Ingle et al. |
| 2014/0262038 A1 | 9/2014 | Wang et al. |
| 2014/0273460 A1 | 9/2014 | Reyland et al. |
| 2015/0009906 A1 | 1/2015 | Dore et al. |
| 2015/0010381 A1 | 1/2015 | Cai |
| 2015/0017810 A1 | 1/2015 | Guha |
| 2015/0037183 A1 | 2/2015 | Rood et al. |
| 2015/0059859 A1 | 3/2015 | Takahashi et al. |
| 2015/0099066 A1 | 4/2015 | Huotari et al. |
| 2015/0179412 A1 | 6/2015 | Chhatre et al. |
| 2015/0181684 A1 | 6/2015 | Banna et al. |
| 2015/0184287 A1 | 7/2015 | Tsung et al. |
| 2015/0234390 A1 | 8/2015 | Koyomogi et al. |
| 2015/0287572 A1 | 10/2015 | Daugherty et al. |
| 2015/0340209 A1 | 11/2015 | Koltonski |
| 2015/0371831 A1 | 12/2015 | Rozenzon et al. |
| 2016/0039126 A1 | 2/2016 | Tan et al. |
| 2016/0111258 A1 | 4/2016 | Taskar et al. |
| 2016/0181116 A1 | 6/2016 | Berry, III et al. |
| 2016/0211165 A1 | 7/2016 | McChesney et al. |
| 2016/0211166 A1 | 7/2016 | Yan et al. |
| 2016/0215392 A1 | 7/2016 | Yudovsky et al. |
| 2016/0247688 A1 | 8/2016 | Zhu et al. |
| 2016/0293431 A1 | 10/2016 | Sriraman et al. |
| 2017/0018407 A1 | 1/2017 | Kondo |
| 2017/0018411 A1* | 1/2017 | Sriraman ............ H01J 37/32541 |
| 2017/0032982 A1 | 2/2017 | Drewery et al. |
| 2017/0032987 A1* | 2/2017 | Lee ............... H01L 21/68735 |
| 2017/0069511 A1 | 3/2017 | Yang et al. |
| 2017/0110335 A1 | 4/2017 | Yang et al. |
| 2017/0200586 A1 | 7/2017 | Treadwell et al. |
| 2017/0213758 A1 | 7/2017 | Rice et al. |
| 2017/0236688 A1 | 8/2017 | Caron et al. |
| 2017/0236694 A1 | 8/2017 | Eason et al. |
| 2017/0236741 A1 | 8/2017 | Angelov et al. |
| 2017/0236743 A1 | 8/2017 | Severson et al. |
| 2017/0278679 A1 | 9/2017 | Angelov et al. |
| 2017/0287682 A1 | 10/2017 | Musselman et al. |
| 2017/0287753 A1 | 10/2017 | Musselman et al. |
| 2018/0053629 A1 | 2/2018 | Zhang et al. |
| 2019/0013232 A1 | 1/2019 | Yan et al. |
| 2019/0027988 A1 | 1/2019 | Filipenko et al. |

(56) References Cited

U.S. PATENT DOCUMENTS

| | | | |
|---|---|---|---|
| 2019/0279888 | A1 | 9/2019 | Gopalakrishnan et al. |
| 2020/0004954 | A1 | 1/2020 | Zawadowskiy et al. |
| 2020/0049547 | A1 | 2/2020 | Spyropoulos et al. |

FOREIGN PATENT DOCUMENTS

| | | | |
|---|---|---|---|
| CN | 101552182 | A | 10/2009 |
| CN | 102243977 | A | 11/2011 |
| CN | 102315150 | A | 1/2012 |
| CN | 103730318 | A | 4/2014 |
| CN | 104299929 | A | 1/2015 |
| CN | 104752141 | A | 7/2015 |
| CN | 104851832 | A | 8/2015 |
| CN | 105336561 | A | 2/2016 |
| CN | 107093569 | A | 8/2017 |
| CN | 107768275 | A | 3/2018 |
| EP | 0424299 | A2 | 4/1991 |
| EP | 0838842 | A2 | 4/1998 |
| JP | H10-280173 | A | 10/1998 |
| JP | 2001-230239 | A | 8/2001 |
| JP | 2002503765 | A | 2/2002 |
| JP | 2002176030 | A | 6/2002 |
| JP | 2002-217171 | A | 8/2002 |
| JP | 2006173223 | A | 6/2006 |
| JP | 2006186171 | A | 7/2006 |
| JP | 2006-344701 | A | 12/2006 |
| JP | 2007207808 | A | 8/2007 |
| JP | 2007-234867 | A | 9/2007 |
| JP | 2007535819 | A | 12/2007 |
| JP | 2008027936 | A | 2/2008 |
| JP | 2010034416 | A | 2/2010 |
| JP | 2011-54933 | A | 3/2011 |
| JP | 2011210853 | A | 10/2011 |
| JP | 2012-049376 | A | 3/2012 |
| JP | 2012-216614 | A | 11/2012 |
| JP | 2013511847 | A | 4/2013 |
| JP | 2013526063 | A | 6/2013 |
| JP | 2013530516 | A | 7/2013 |
| JP | 2015201552 | A | 11/2015 |
| KR | 20040050080 | A | 6/2004 |
| KR | 20050008792 | A | 1/2005 |
| KR | 100783062 | B1 | 12/2007 |
| KR | 20080013552 | A | 2/2008 |
| KR | 20080023569 | A | 3/2008 |
| KR | 20130137962 | A | 12/2008 |
| KR | 2010-0105695 | A | 9/2010 |
| KR | 20100123724 | A | 11/2010 |
| KR | 2011-0125188 | A | 11/2011 |
| KR | 20140001540 | A | 1/2014 |
| KR | 2014-0132542 | A | 11/2014 |
| KR | 101974420 | B1 | 5/2019 |
| KR | 101974422 | B1 | 5/2019 |
| TW | 506234 | B | 10/2002 |
| TW | 200302035 | A | 7/2003 |
| TW | 200520137 | A | 6/2005 |
| TW | 201001588 | A | 1/2010 |
| TW | 201207933 | A | 2/2012 |
| TW | 201324653 | A | 6/2013 |
| TW | 201347063 | A | 11/2013 |
| TW | 201426854 | A | 7/2014 |
| TW | 201436089 | A | 9/2014 |
| TW | 201447965 | A | 12/2014 |
| TW | 201528310 | A | 7/2015 |
| TW | 201601208 | A | 1/2016 |
| WO | WO-0040776 | A1 | 7/2000 |
| WO | WO-2007008509 | A2 | 1/2007 |
| WO | WO-2011051251 | A1 | 5/2011 |
| WO | WO-2013123617 | A1 | 8/2013 |
| WO | WO-2014068886 | A1 | 5/2014 |
| WO | WO-2014163742 | A1 | 10/2014 |

OTHER PUBLICATIONS

Office Action issued in corresponding Japanese Patent Application 2016-143886 dated Sep. 8, 2020.
Translation of First Office Action dated Sep. 28, 2020 corresponding to Korean Patent Application No. 10-2018-0114808, 3 pages.
Translation of Notification of Examination Opinions corresponding to Taiwanese Patent Application No. 106101332 dated Nov. 19, 2020, 9 pages.
D. A. Jobson. "On the Flow of a Compressible Fluid through Orifices." Proceedings of the Institution of Mechanical Engineers. 169[1 ](1955). pp. 767-776. https://doi.org/10.1243/PIME_PROC_1955_169_077_02 (Year: 1955).
Cashco, Inc. "Fluid Flow Basics ofThrottling Valves." 1999. pp. 1-56. Available Mar. 24, 2020 online at: https://www.controlglobal.com/assets/Media/MediaManager/RefBook_ Cash co_Fluid. pdf. (Year: 1999).
O'Keefe Controls Co. "Choked Flow of Gases." in Catalog 11. 2003. pp. 20-24 & 48. (Year: 2003).
Christophe Corre. "Lecture 5: Quasi-1 D compressible Flows" in "Fundamentals of Compressible and Viscous Flow Analysis—Part II." 2018. pp. 94-148. Ecole Centrale de Lyon. Fluid Mechanics and Acoustics Laboratory (LMFA ). http://lmfa.ec-lyon. (Year: 2018).
Notification of Examination Opinions corresponding to Taiwanese Patent Application No. 10512352 dated Feb. 19, 2020, 5 pages.
First Office Action dated Mar. 17, 2020 corresponding to Chinese Patent Application 20170076027.2, 8 pages.
First Office Action with Translation dated Sep. 7, 2021 corresponding to Korean Patent Application No. 10-2017-0083210, 6 pages.
First Office Action with Translation dated Oct. 7, 2021 corresponding to Japanese Patent Application No. 2017-154893, 7 pages.
U.S. Appl. No. 14/945,680, John Drewery.
U.S. Appl. No. 15/013,400, Yang et al.
U.S. Appl. No. 15/014,539, Yang et al.
U.S. Appl. No. 15/399,692, Treadwell et al.
U.S. Appl. No. 15/427,163, filed Feb. 8, 2017, Kwame Eason et al.
U.S. Appl. No. 62/275,837, filed Jan. 7, 2016, Jason Lee Treadwell et al.
MP125E N-470 Linear Drive User Manual; Version 1.1.0; Date Sep. 18, 2014; 54 Pages; Physik Instruments (PI) GmbH & Co. KG, Auf der Roemerstr. 1, 76228 Karlsruhe, Germany.
First Office Action dated Dec. 29, 2017 corresponding to Chinese Patent Application No. 201610032252.1, 12 pages.
First Office Action dated Aug. 2, 2018 corresponding to Chinese Patent Application No. 201710036188.9, 7 pages.
Bohr, Mark, "The New Era of Scaling in an SoC World" Intel Logic Technology Development; ISSCC; 2009; 66 Pages.
Dusa, Mircean et al., "Pitch Doubling Through Dual Patterning Lithography Challenges in Integration and Litho Budgets," Optical Microlithography XX, vol. 6520, 65200G, (2007); 10 pages.
U.S. Office Action dated Oct. 5, 2015 issued in U.S. Appl. No. 14/576,020.
Blain et al. (Jul./Aug. 1996) "Role of nitrogen in the downstream etching of silicon nitride," Journal of Vacuum Science & Technology A, 14(4):2151-2157.
Blain (Mar./Apr. 1999) "Mechanism of nitrogen removal from silicon nitride by nitric oxide," Journal of Vacuum Science & Technology A, 17(2):665-667.
Kastenmeier et al. (Nov/Dec. 1999) "Highly selective etching of silicon nitride over silicon and silicon dioxide," J. Vac. Sci. Technol. A, American Vacuum Society, I7 (6):3179-3184.
Kastenmeier et al. (Sep/Oct. 1996) "Chemical dry etching of silicon nitride and silicon dioxide using CF4/O2/N2 gas mixtures," J. Vac. Sci. Technol. A14(5):2802-2813.
Oehrlein et al. (1996) "Study of plasma-surface interactions: chemical dry etching and high-density plasma etching," Plasma Sources Sci. Technol. 5:193-199.
Tajima et al. (2013) "Room-Temperature Si Etching in NO/F2 Gases and the Investigation of Surface Reaction Mechanisms," The Journal of Physical Chemistry C, 117:5118-5125.

(56) References Cited

OTHER PUBLICATIONS

Yun et al. (2007) "Large Etch Rate Enhancement by NO-Induced Surface Chemical Reaction during Chemical Dry Etching of Silicon Oxide in F2 Remote Plasmas," Journal of The Electrochemical Society, 154(4):D267-D272.

U.S. Final Ofice Action dated Feb. 26, 2016 issued in U.S. Appl. No. 14/576,020.

U.S. Office Action dated Sep. 23, 2016 issued in U.S. Appl. No. 14/576,020.

European Extended Search Report dated May 30, 2016 issued in EP 15 199 363.1.

U.S. Appl. No. 62/106,407, filed Jan. 22, 2015, in the names of Joseph Yudovsky et al., & entitled "Injector for Spatially Separated Atomic Layer Deposition Chamber" pp. 1-68. (Year: 2015).

U.S. Appl. No. 62/065,497, entitled "Gas Supply Delivery Arrangement Including a Gas Splitter for Tunable Gas Flow Control," filed Oct. 17, 2014, in the names of Mark Taskar et al. (Year: 2014).

First Chinese Office Action for Chinese Application No. 201710013856.6 dated Oct. 21, 2019.

First Chinese Office Action for Chinese Application No. CN201710076420.1 dated Dec. 17, 2019. No translation provided. 11 pages.

First Office Action corresponding to Japanese Application No. 2018-186353, dated Jan. 21, 2020, 8 pages.

First Office Action corresponding to Japanese Application No. 2016-004302, dated Jan. 28, 2020, 4 pages.

U.S. Appl. No. 15/422,823, filed Feb. 2, 2017, Ivelin Angelov et al.

\* cited by examiner

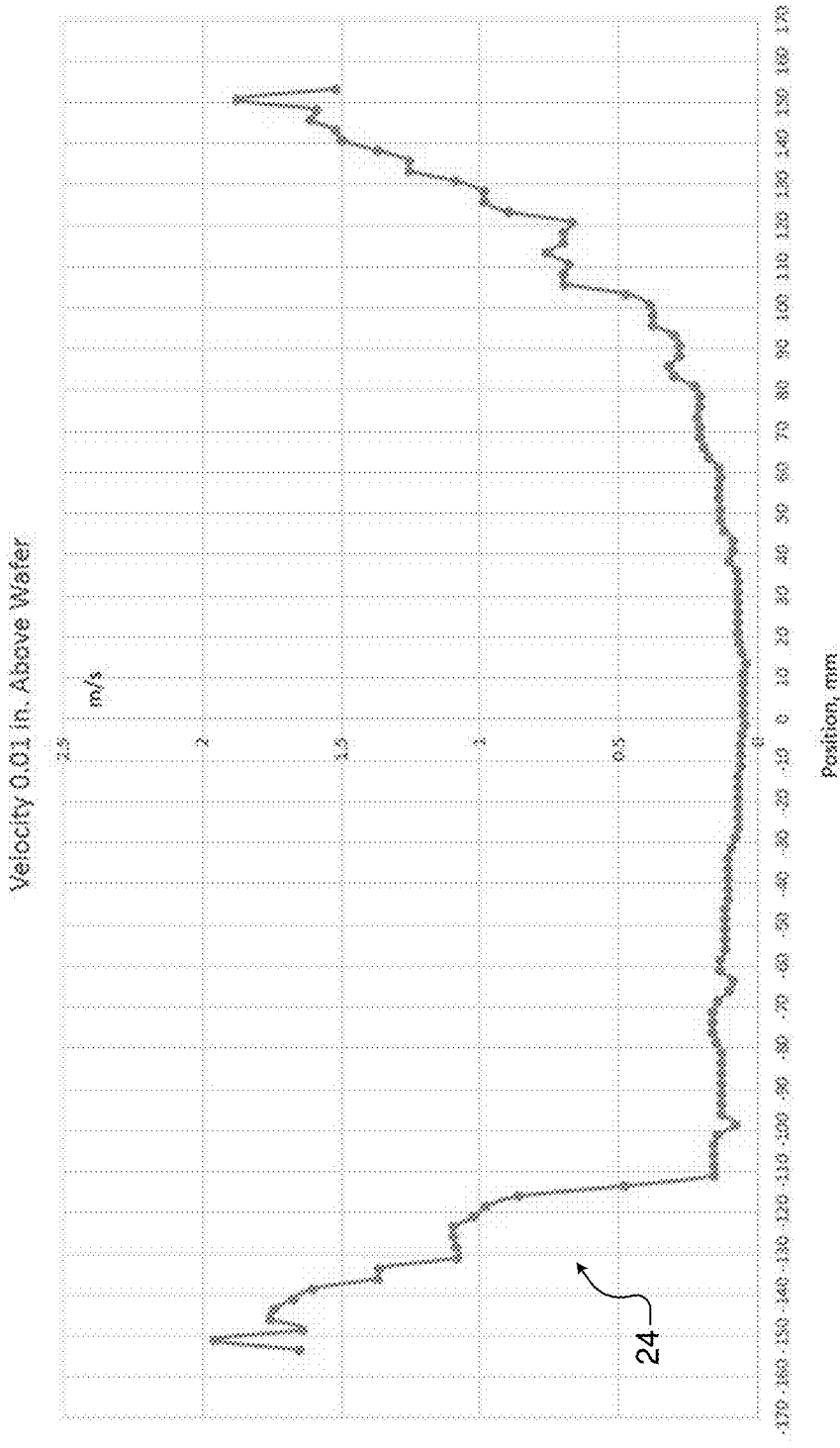

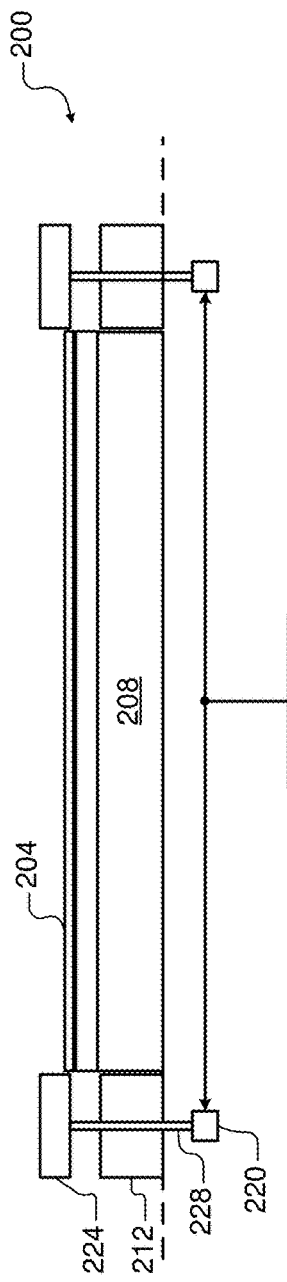
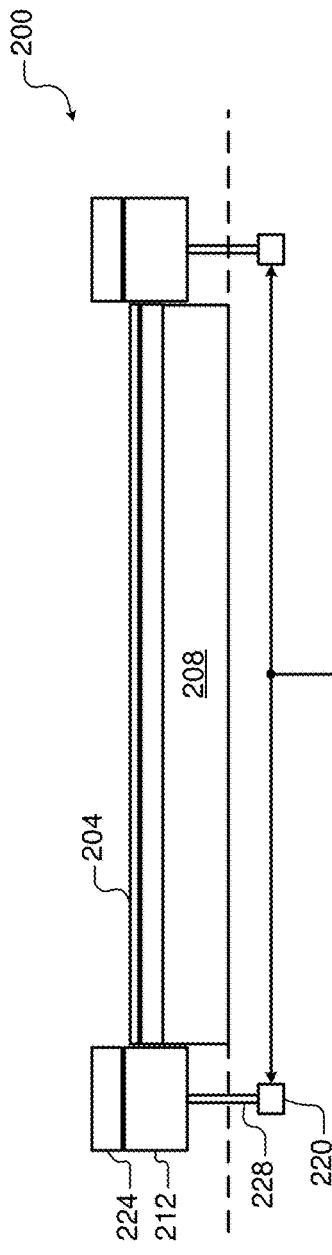
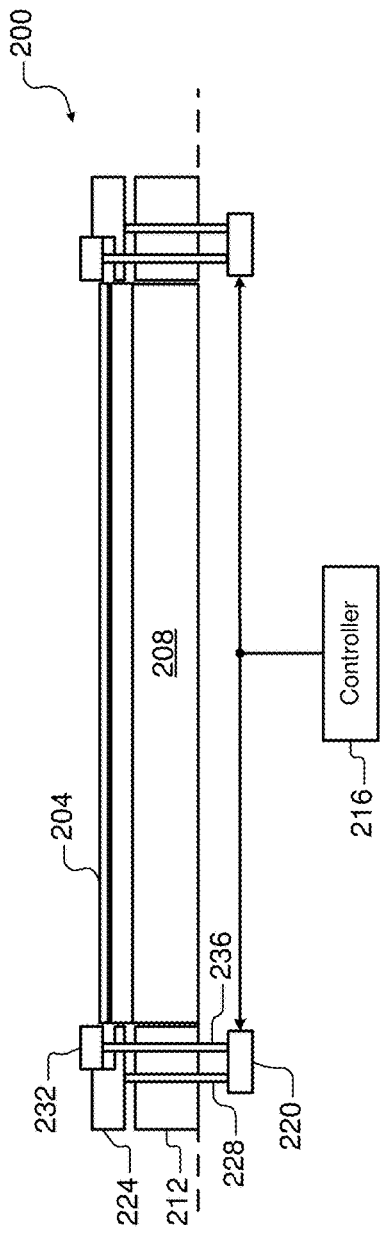

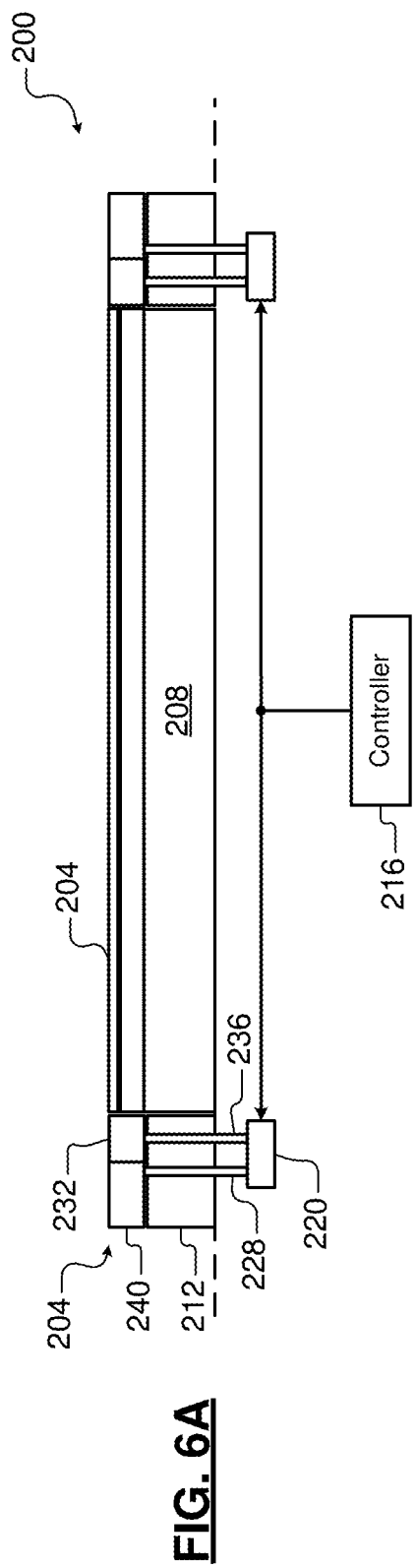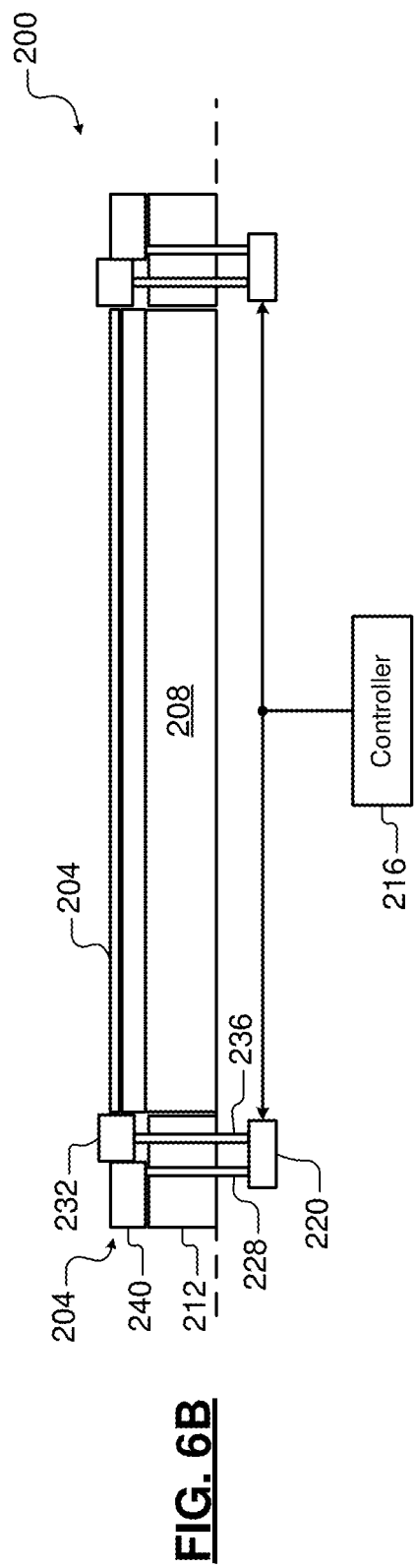

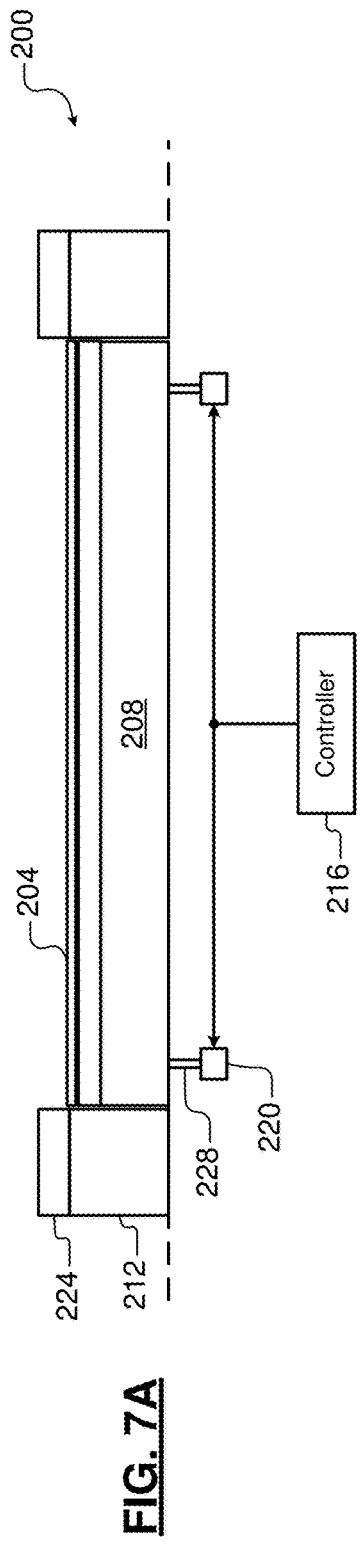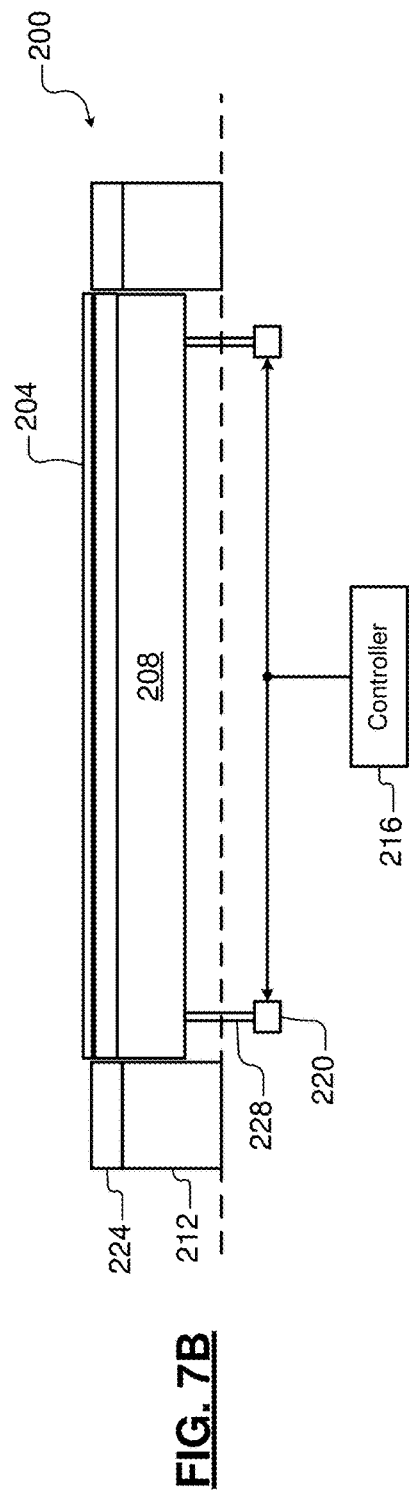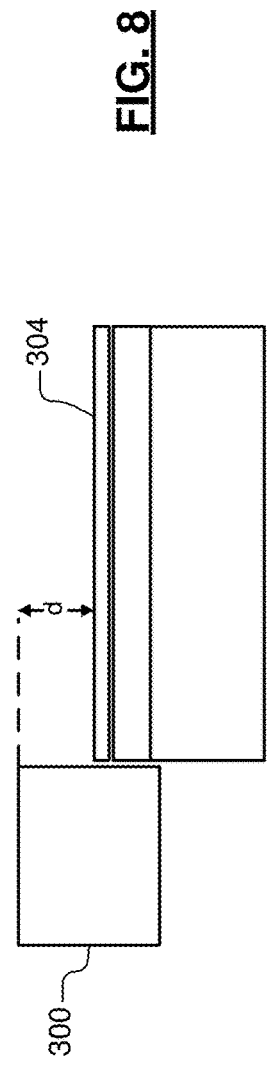

VARIABLE DEPTH EDGE RING FOR ETCH UNIFORMITY CONTROL

CROSS-REFERENCE TO RELATED APPLICATIONS

The present disclosure is a divisional of U.S. patent application Ser. No. 15/422,823, filed on Feb. 2, 2017, which claims the benefit of U.S. Provisional Application No. 62/294,593, filed on Feb. 12, 2016. The entire disclosure of the application referenced above is incorporated herein by reference.

FIELD

The present disclosure relates to substrate processing, and more particularly to systems and methods for controlling etch uniformity in substrate processing.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system may be used to etch film on a substrate such as a semiconductor wafer. The substrate processing system typically includes a processing chamber, a gas distribution device and a substrate support. During processing, the substrate is arranged on the substrate support. Different gas mixtures may be introduced into the processing chamber and radio frequency (RF) plasma may be used to activate chemical reactions.

The substrate support may include an edge ring arranged around an outer portion (e.g., outside of and/or adjacent to a perimeter) of the substrate support. The edge ring may be provided to confine plasma to a volume above the substrate, protect the substrate support from erosion caused by the plasma, etc.

SUMMARY

A substrate support includes an inner portion arranged to support a substrate, an edge ring surrounding the inner portion, and a controller that calculates a desired pocket depth of the substrate support. Pocket depth corresponds to a distance between an upper surface of the edge ring and an upper surface of the substrate. Based on the desired pocket depth, the controller selectively controls an actuator to raise and lower at least one of the edge ring and the inner portion to adjust the distance between the upper surface of the edge ring and the upper surface of the substrate.

A method of operating a substrate support includes arranging a substrate on an inner portion of the substrate support and calculating a desired pocket depth of the substrate support. Pocket depth corresponds to a distance between an upper surface of an edge ring surrounding the inner portion and an upper surface of the substrate. The method further includes, based on the desired pocket depth, selectively controlling an actuator to raise and lower at least one of the edge ring and the inner portion to adjust the distance between the upper surface of the edge ring and the upper surface of the substrate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 2A, 2B, and 2C illustrate example gas velocity profiles according to the present disclosure;

FIGS. 5A, 5B, and 5C show example variable depth edge rings in a raised position according to the present disclosure;

FIGS. 6A and 6B show another example variable depth edge ring according to the present disclosure;

FIG. 7A shows an example substrate support in a lowered position according to the present disclosure;

FIG. 7B shows an example substrate support in a raised position according to the present disclosure;

FIG. 8 shows an example adjustable pocket depth defined by an edge ring according to the present disclosure;

In the drawings, reference numbers may be reused to identify similar and/or identical elements.

DETAILED DESCRIPTION

A substrate support in a substrate processing system may include an edge ring. An upper surface of the edge ring may extend above an upper surface of the substrate support. Accordingly, the upper surface of the substrate support (and, in some examples, an upper surface of a substrate arranged on the substrate support) may be recessed relative to the edge ring. This recess may be referred to as a pocket. A distance between the upper surface of the edge ring and the upper surface of the substrate may be referred to as a "pocket depth." Generally, the pocket depth is fixed according to a height of the edge ring relative to the upper surface of the substrate. If a different pocket depth is required, the edge ring must be manually replaced, which may be limited by wafer handling constraints, process constraints, chamber constraints, etc.

Figures 1A, 1B:
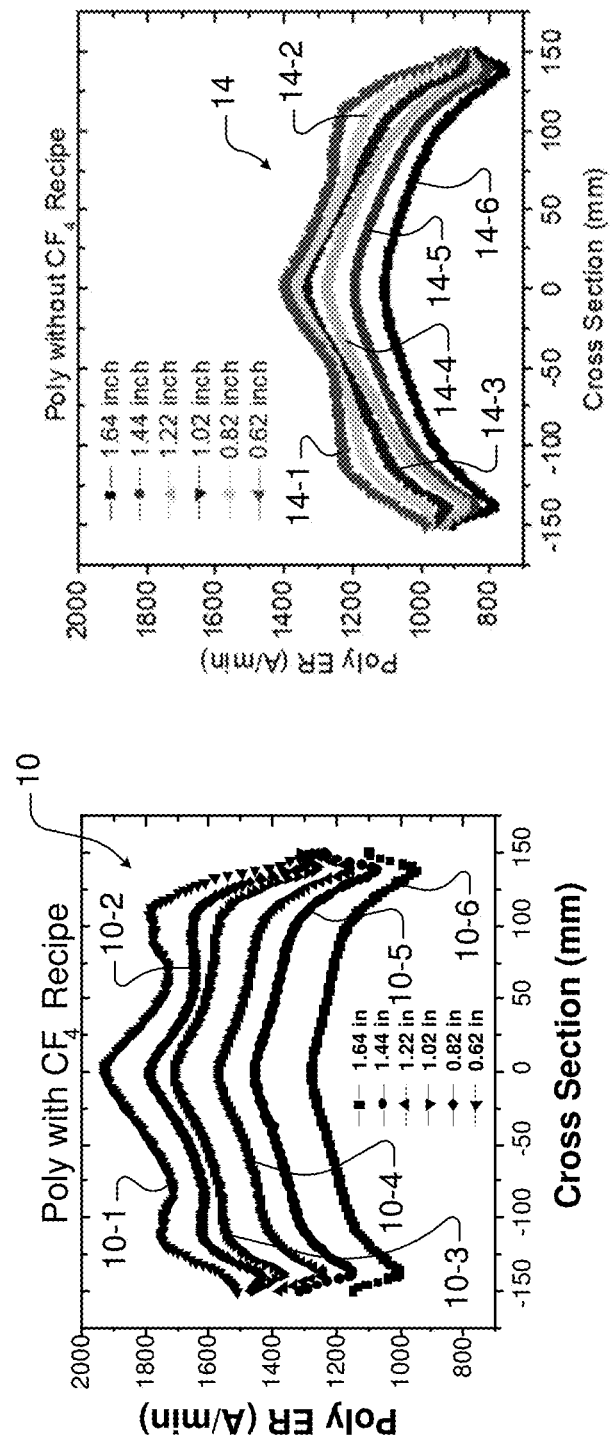
FIGS. 1A and 1B illustrate example etch rates according to the present disclosure.

Some aspects of etch processing may vary due to characteristics of the substrate processing system, the substrate, gas mixtures, etc. For example, an etch rate and etch uniformity may vary according to the pocket depth of the edge ring. In FIGS. 1A and 1B, curves show etch rates 10 and 14 in an example poly etch process with a recipe including $CF_4$ and an example poly etch process with a recipe that does not include $CF_4$, respectively. In FIGS. 1A and 1B, the y axes indicate etch rate (ER) in Angstroms per minute (A/min) while the x axes indicate a radial distance (in mm) from a center of a substrate. The etch rates 10 and 14 each include a plurality of etch rates corresponding to a distance between an upper surface of the substrate and a bottom surface of a gas distribution device (e.g., a showerhead). For example, the etch rates 10 include etch rates 10-1, 10-2, 10-3, 10-4, 10-5, and 10-6, corresponding to distances of 0.62 inches, 0.82 inches, 1.02 inches, 1.22 inches, 1.44 inches, and 1.64 inches, respectively. The etch rates 14 include etch rates 14-1, 14-2, 14-3, 14-4, 14-5, and 14-6, corresponding to distances of 0.62 inches, 0.82 inches, 1.02 inches, 1.22 inches, 1.44 inches, and 1.64 inches, respectively.

As shown, the overall etch rates 10 and 14 generally decrease as the distance between the upper surface of the substrate and the bottom surface of the gas distribution device increases (e.g., from 0.62 inches in a bottommost of the etch rates 10 and 14 to 1.64 inches in a topmost of the etch rates 10 and 14). Further, the etch rates 10 and 14 vary (e.g., generally decrease) from the center of the substrate to an outer perimeter of the substrate, and generally approach a minimum and an inflection point at approximately 140 mm (approximately 5.51 inches) from the center. The etch rates 10 and 14 increase sharply at distances beyond 140 mm from the center of the substrate. This inflection point may vary with process parameters including, but not limited to, a maximum gas velocity across the upper surface of the substrate.

Figure 2A:
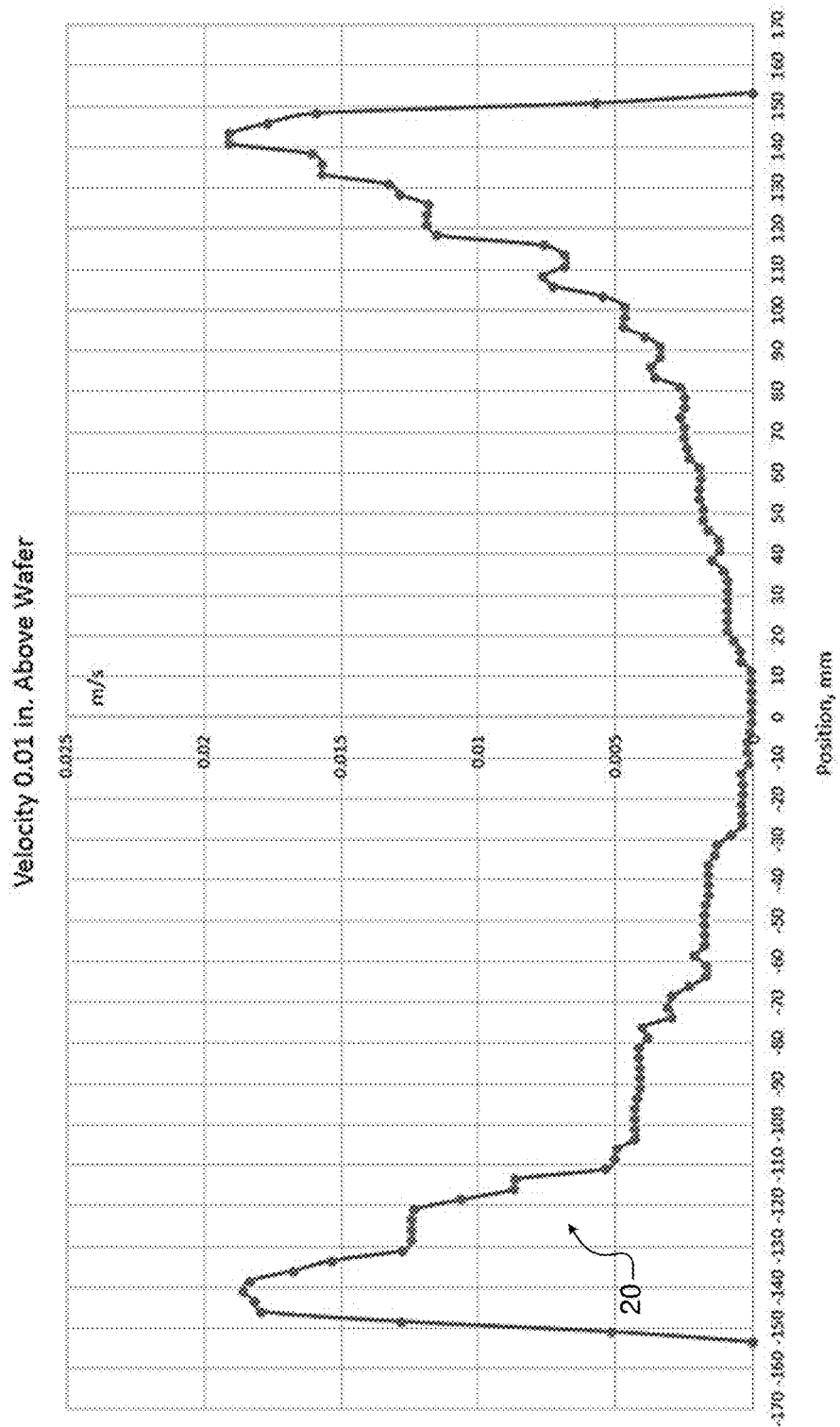
Figure 2C:
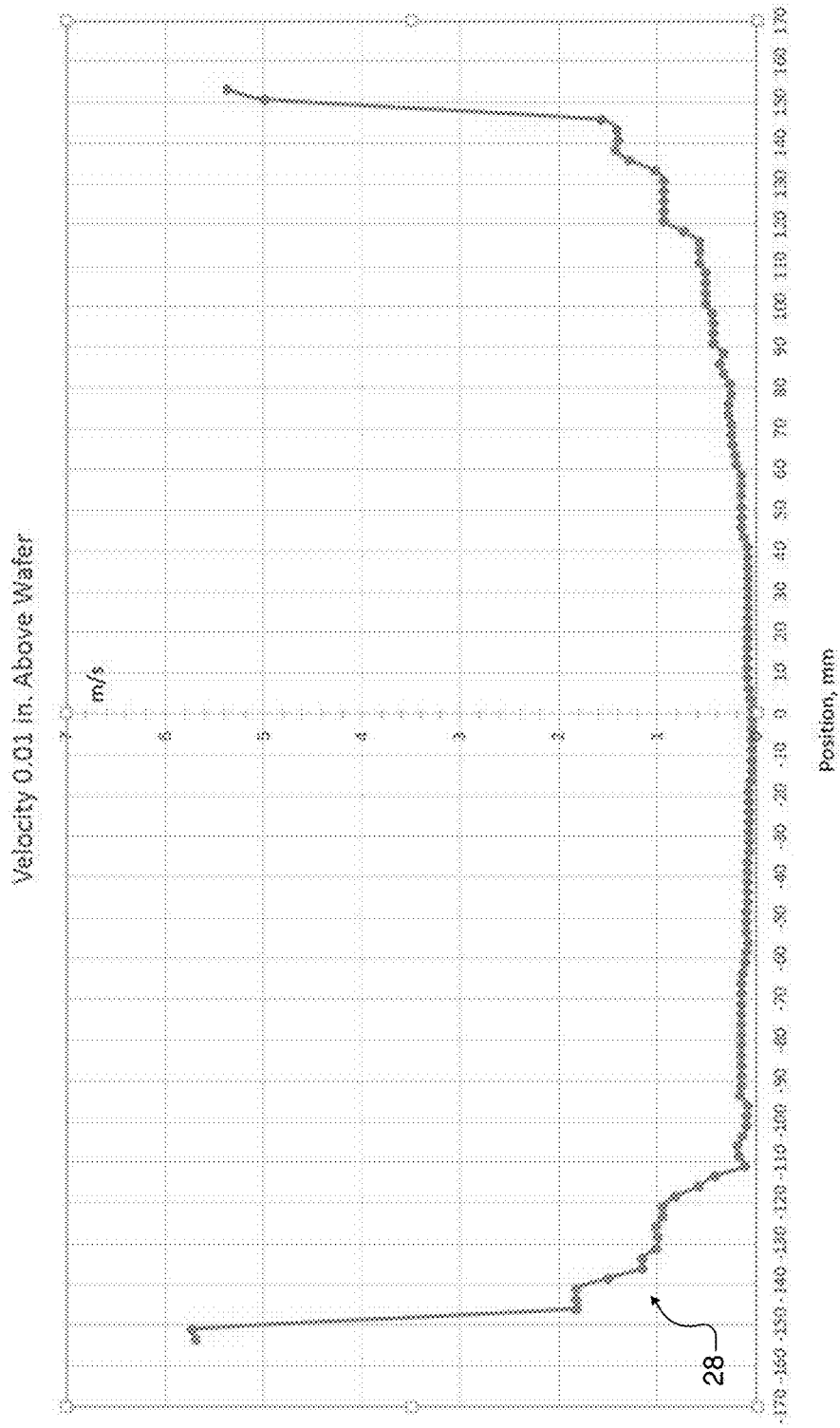

Varying a height of the edge ring may modify the gas velocity profile across the surface of the substrate. FIGS. 2A, 2B, and 2C illustrate example gas velocity profiles 20, 24, and 28 with different edge ring heights and corresponding pocket depths. In FIG. 2A, the upper surface of the edge ring has a height of approximately 0.042 inches above the upper surface of the substrate. In FIG. 2B, the upper surface of the edge ring has a height of approximately equal to (i.e. 0.0 inches above) the upper surface of the substrate. In FIG. 2C, the upper surface of the edge ring has a height of approximately 0.03 inches below the upper surface of the substrate. Accordingly, as pocket depth varies, etch rate uniformity (including maximum and minimum etch rates locations of peaks, locations of inflection points, etc.) also varies.

Variable depth edge ring systems and methods according to the principles of the present disclosure raise and lower the edge ring to control pocket depth based on desired process parameters. For example, the edge ring may be coupled to an actuator configured to raise and lower the edge ring in response to a controller, user interface, etc. In one example, a controller of the substrate processing system controls the height of the edge ring during a process, between process steps, etc. according to a particular recipe being performed. For example only, the controller may store data (e.g., a lookup table) that indexes pocket depth, edge ring height, etc. to one or more parameters including, but not limited to, a selected recipe or process, a selected process step, a desired gas velocity, desired inflection points, etc. The data may correspond to predetermined (e.g., calibrated or programmed) data, data provided by a user via an interface, etc. In this manner, a range of pocket depths can be achieved without replacing or manually adjusting the edge ring for different recipes, steps, process parameters, etc.

Figure 3:
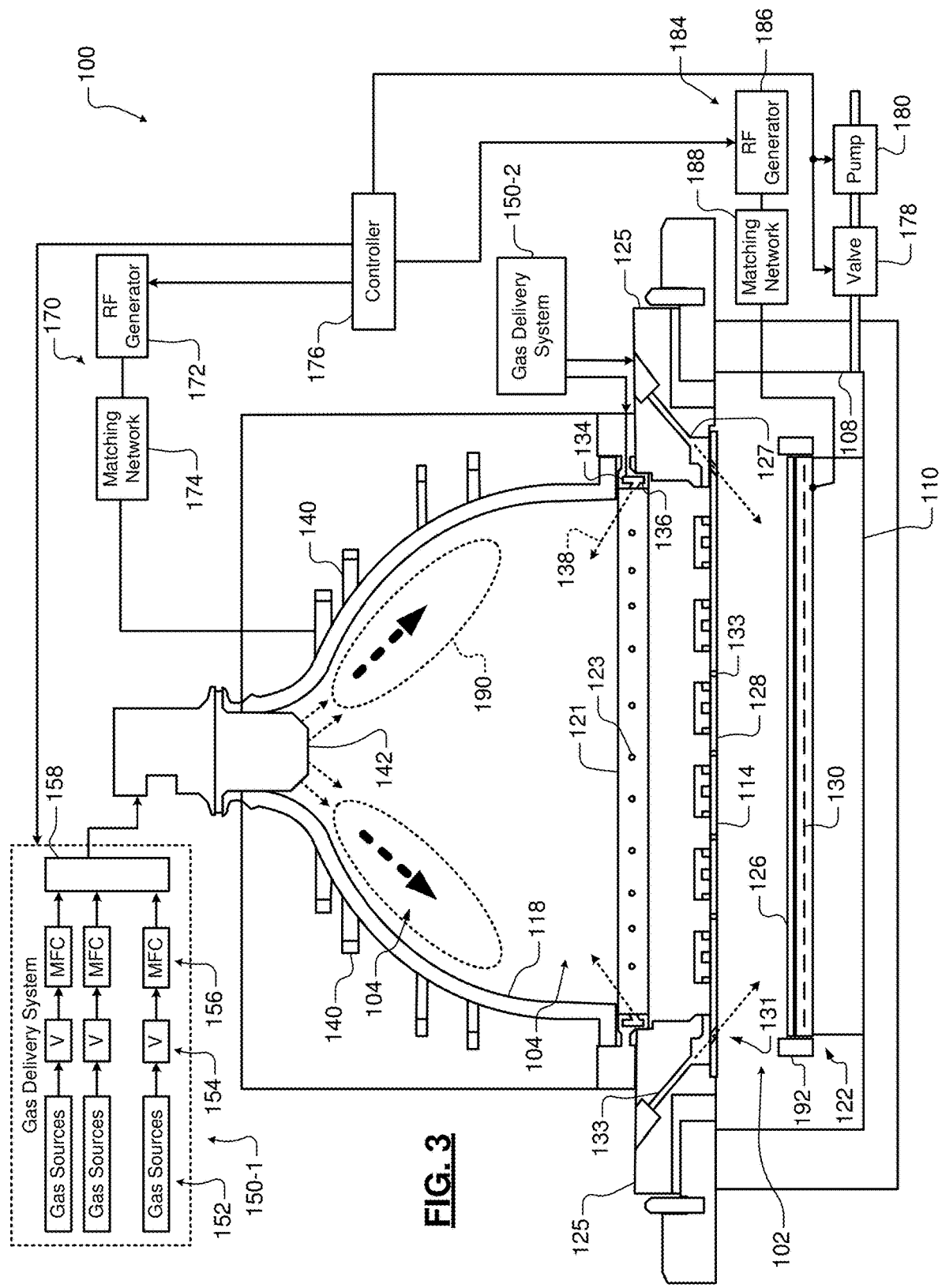
FIG. 3 is a functional block diagram of an example processing chamber according to the present disclosure.

Referring now to FIG. 3, an example of a substrate processing chamber 100 for etching a layer (for example only, a tungsten, or W, layer) of a substrate according to the present disclosure is shown. While a specific substrate processing chamber is shown and described, the methods described herein may be implemented on other types of substrate processing systems.

The substrate processing chamber 100 includes a lower chamber region 102 and an upper chamber region 104. The lower chamber region 102 is defined by chamber sidewall surfaces 108, a chamber bottom surface 110 and a lower surface of a gas distribution device 114.

The upper chamber region 104 is defined by an upper surface of the gas distribution device 114 and an inner surface of a dome 118. In some examples, the dome 118 rests on a first annular support 121. In some examples, the first annular support 121 includes one or more spaced holes 123 for delivering process gas to the upper chamber region 104, as will be described further below. In some examples, the process gas is delivered by the one or more spaced holes 123 in an upward direction at an acute angle relative to a plane including the gas distribution device 114, although other angles/directions may be used. In some examples, a gas flow channel 134 in the first annular support 121 supplies gas to the one or more spaced holes 123.

The first annular support 121 may rest on a second annular support 125 that defines one or more spaced holes 127 for delivering process gas from a gas flow channel 129 to the lower chamber region 102. In some examples, holes 131 in the gas distribution device 114 align with the holes 127. In other examples, the gas distribution device 114 has a smaller diameter and the holes 131 are not needed. In some examples, the process gas is delivered by the one or more spaced holes 127 in a downward direction towards the substrate at an acute angle relative to the plane including the gas distribution device 114, although other angles/directions may be used.

In other examples, the upper chamber region 104 is cylindrical with a flat top surface and one or more flat inductive coils may be used. In still other examples, a single chamber may be used with a spacer located between a showerhead and the substrate support.

A substrate support 122 is arranged in the lower chamber region 102. In some examples, the substrate support 122 includes an electrostatic chuck (ESC), although other types of substrate supports can be used. A substrate 126 is arranged on an upper surface of the substrate support 122 during etching. In some examples, a temperature of the substrate 126 may be controlled by a heater plate 130, an optional cooling plate with fluid channels and one or more sensors (not shown); although any other suitable substrate support temperature control system may be used.

In some examples, the gas distribution device 114 includes a showerhead (for example, a plate 128 having a plurality of spaced holes 133). The plurality of spaced holes 133 extend from the upper surface of the plate 128 to the lower surface of the plate 128. In some examples, the spaced holes 133 have a diameter in a range from 0.4" to 0.75" and the showerhead is made of a conducting material such as aluminum or a non-conductive material such as ceramic with an embedded electrode made of a conducting material.

One or more inductive coils 140 are arranged around an outer portion of the dome 118. When energized, the one or more inductive coils 140 create an electromagnetic field inside of the dome 118. In some examples, an upper coil and a lower coil are used. A gas injector 142 injects one or more gas mixtures from a gas delivery system 150-1.

In some examples, a gas delivery system 150-1 includes one or more gas sources 152, one or more valves 154, one or more mass flow controllers (MFCs) 156, and a mixing manifold 158, although other types of gas delivery systems may be used. A gas splitter (not shown) may be used to vary flow rates of a gas mixture. Another gas delivery system 150-2 may be used to supply an etch gas or an etch gas mixture to the gas flow channels 129 and/or 134 (in addition to or instead of etch gas from the gas injector 142).

Suitable gas delivery systems are shown and described in commonly assigned U.S. patent application Ser. No. 14/945,680, entitled "Gas Delivery System" and filed on Dec. 4, 2015, which is hereby incorporated by reference in its entirety. Suitable single or dual gas injectors and other gas injection locations are shown and described in commonly assigned U.S. Provisional Patent Application Ser. No. 62/275,837, entitled "Substrate Processing System with Multiple Injection Points and Dual Injector" and filed on Jan. 7, 2016, which is hereby incorporated by reference in its entirety.

In some examples, the gas injector 142 includes a center injection location that directs gas in a downward direction and one or more side injection locations that inject gas at an angle with respect to the downward direction. In some examples, the gas delivery system 150-1 delivers a first portion of the gas mixture at a first flow rate to the center injection location and a second portion of the gas mixture at a second flow rate to the side injection location(s) of the gas injector 142. In other examples, different gas mixtures are delivered by the gas injector 142. In some examples, the gas delivery system 150-1 delivers tuning gas to the gas flow channels 129 and 134 and/or to other locations in the processing chamber as will be described below.

A plasma generator 170 may be used to generate RF power that is output to the one or more inductive coils 140. Plasma 190 is generated in the upper chamber region 104. In some examples, the plasma generator 170 includes an RF generator 172 and a matching network 174. The matching network 174 matches an impedance of the RF generator 172 to the impedance of the one or more inductive coils 140. In some examples, the gas distribution device 114 is connected to a reference potential such as ground. A valve 178 and a pump 180 may be used to control pressure inside of the lower and upper chamber regions 102, 104 and to evacuate reactants.

A controller 176 communicates with the gas delivery systems 150-1 and 150-2, the valve 178, the pump 180, and/or the plasma generator 170 to control flow of process gas, purge gas, RF plasma and chamber pressure. In some examples, plasma is sustained inside the dome 118 by the one or more inductive coils 140. One or more gas mixtures are introduced from a top portion of the chamber using the gas injector 142 (and/or holes 123) and plasma is confined within the dome 118 using the gas distribution device 114.

Confining the plasma in the dome 118 allows volume recombination of plasma species and effusing desired etchant species through the gas distribution device 114. In some examples, there is no RF bias applied to the substrate 126. As a result, there is no active sheath on the substrate 126 and ions are not hitting the substrate with any finite energy. Some amount of ions will diffuse out of the plasma region through the gas distribution device 114. However, the amount of plasma that diffuses is an order of magnitude lower than the plasma located inside the dome 118. Most of ions in the plasma are lost by volume recombination at high pressures. Surface recombination loss at the upper surface of the gas distribution device 114 also lowers ion density below the gas distribution device 114.

In other examples, an RF bias generator 184 is provided and includes an RF generator 186 and a matching network 188. The RF bias can be used to create plasma between the gas distribution device 114 and the substrate support or to create a self-bias on the substrate 126 to attract ions. The controller 176 may be used to control the RF bias.

The substrate support 122 includes an edge ring 192. The edge ring 192 according to the principles of the present disclosure is moveable (e.g., moveable upward and downward in a vertical direction) relative to the substrate 126. For example, the edge ring 192 may be controlled via an actuator responsive to the controller 176 as described below in more detail.

Referring now to FIGS. 4A, 4B, and 4C, 5A, 5B, and 5C, example substrate supports 200 having respective substrates 204 arranged thereon according to the principles of the present disclosure are shown. The substrate supports 200 may each include a base or pedestal having an inner portion (e.g., corresponding to an ESC) 208 and an outer portion 212. In examples, the outer portion 212 may be independent from, and moveable in relation to, the inner portion 208. A substrate is arranged on the inner portion 208 for processing. A controller 216 communicates with one or more actuators 220 to selectively raise and lower edge rings 224 to adjust a pocket depth of the supports 200. For example only, each of the edge rings 224 is shown in a fully lowered position in FIGS. 4A, 4B, and 4C and in an example fully raised position in FIGS. 5A, 5B, and 5C. As shown in the examples, the actuators 220 correspond to pin actuators configured to selectively extend and retract pins 228 in a vertical direction. Other suitable types of actuators may be used in other examples. For example only, the edge ring 224 corresponds to a ceramic or quartz edge ring.

Figure 4A:
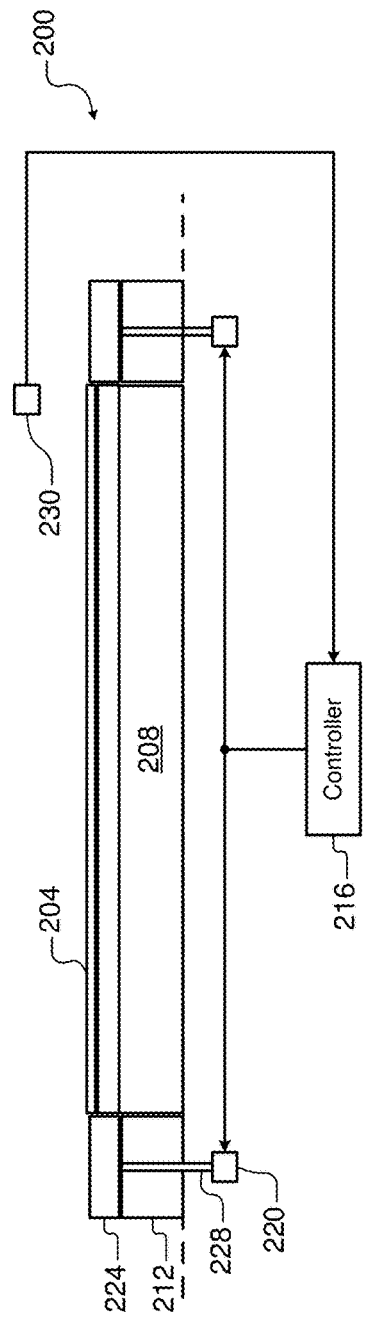
FIGS. 4A, 4B, and 4C show example variable depth edge rings in a lowered position according to the present disclosure.
Figure 4B:
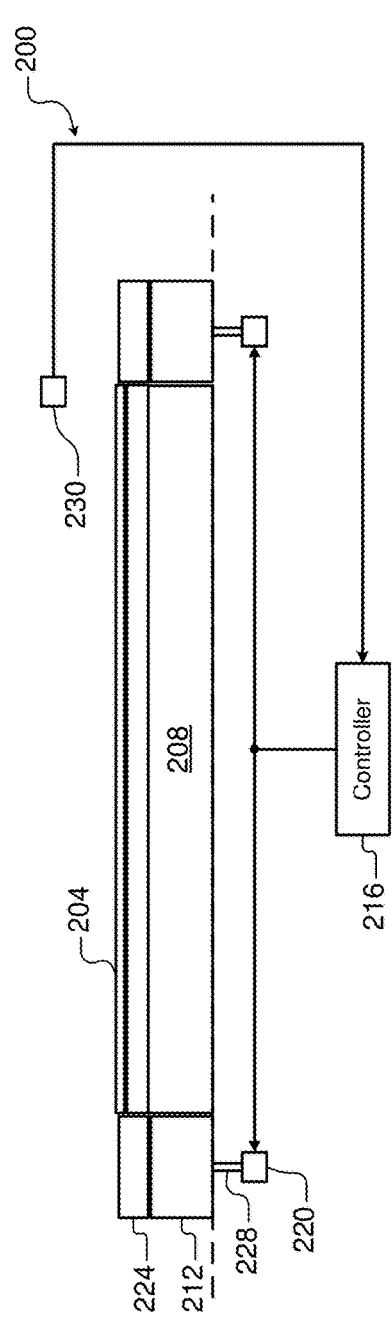
Figure 4C:
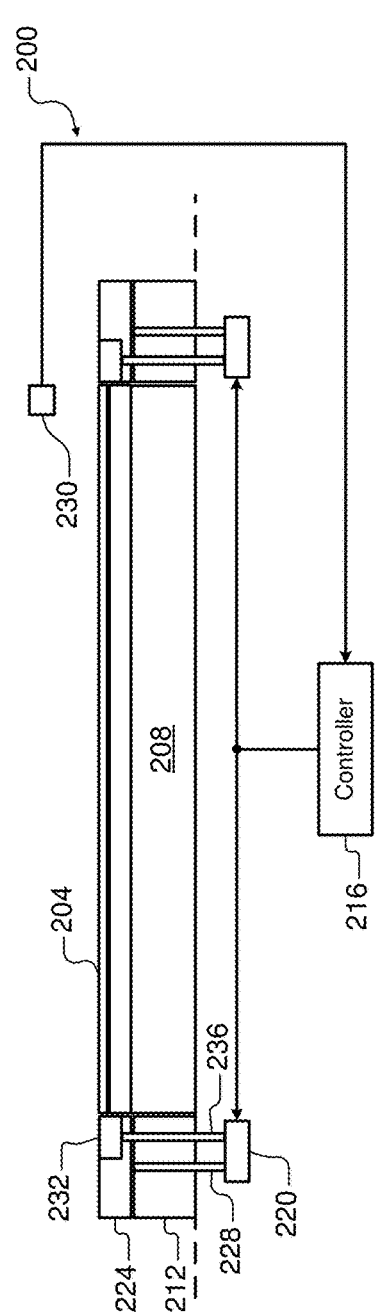

In some examples, the controller 216 adjusts the pocket depth based on feedback indicative of a position of the edge ring 224 and/or the inner portion 208. (i.e., indicative of the pocket depth). In one example, the controller 216 may communicate with an optical sensor 230 configured to determine a position of the edge ring 224 and/or the inner portion 208 based on a signal reflected from a surface of the substrate 204 as shown in FIGS. 4A, 4B, and 4C. In another example, actuators 220 implement position encoders to provide a signal indicative of the position of the edge ring 224 and/or the inner portion 208 to the controller 216. In this manner, the controller 216 may adjust the pocket depth until the actual pocket depth corresponds to the desired pocket depth.

In FIG. 4A, the controller 216 communicates with the actuators 220 to directly raise and lower the edge ring 224 via the pins 228. In FIG. 4B, the controller 216 communicates with the actuators 220 to raise and lower the outer portion 212 having the edge ring 224 mounted thereon. In FIG. 4C, the controller 216 communicates with the actuators 220 to directly raise and lower the edge ring 224 via the pins 228, and/or to directly raise and lower a separate inner ring portion 232 of the edge ring 224 via pins 236.

In FIGS. 6A and 6B, another example edge ring 224 having an independently moveable inner ring portion 232 and outer ring portion 240 is shown. In FIG. 6A, both the inner ring portion 232 and the outer ring portion 240 are shown in a fully lowered position. In FIG. 6B, the inner ring portion 232 is shown in a raised position and the outer ring portion 240 is shown in the fully lowered position. In other examples, both the inner ring portion 232 and the outer ring portion 240 may be actuated to a raised position, the inner ring portion 232 may be fully lowered while the outer ring portion 240 is actuated to a raised position, etc.

In still another example as shown in FIGS. 7A and 7B, the absolute height of the edge ring 224 (and/or the outer portion 212 that the edge ring 224 is mounted on) may be fixed relative to a bottom surface of the chamber. Instead, the inner portion 208 (e.g., the ESC) is moveable relative to the edge ring 224. Accordingly, the controller 216 may communicate with the actuators 220 to raise and lower the inner portion 208 relative to the edge ring 224 to adjust the pocket depth. The inner portion 208 is shown in a fully lowered position in FIG. 7A and in a fully raised position in FIG. 7B.

FIG. 8 shows an example edge ring 300 in a fully raised position to define a pocket depth d with respect to an upper surface of a substrate 304. As described in various examples above, the pocket depth d may be determined according to one or more parameters including, but not limited to, a selected recipe or process, recipe materials or step materials, temperatures, chamber characteristics, user defined variables, a thickness of the substrate being processed, a desired gas velocity profile, desired etch uniformity, etc. The pocket depth d may be automatically controlled by a controller based on predetermined and/or programmed relationships between the parameters and the pocket depth (e.g., using a lookup table, model, etc.), and/or may be controlled according to user inputs.

Figure 9:
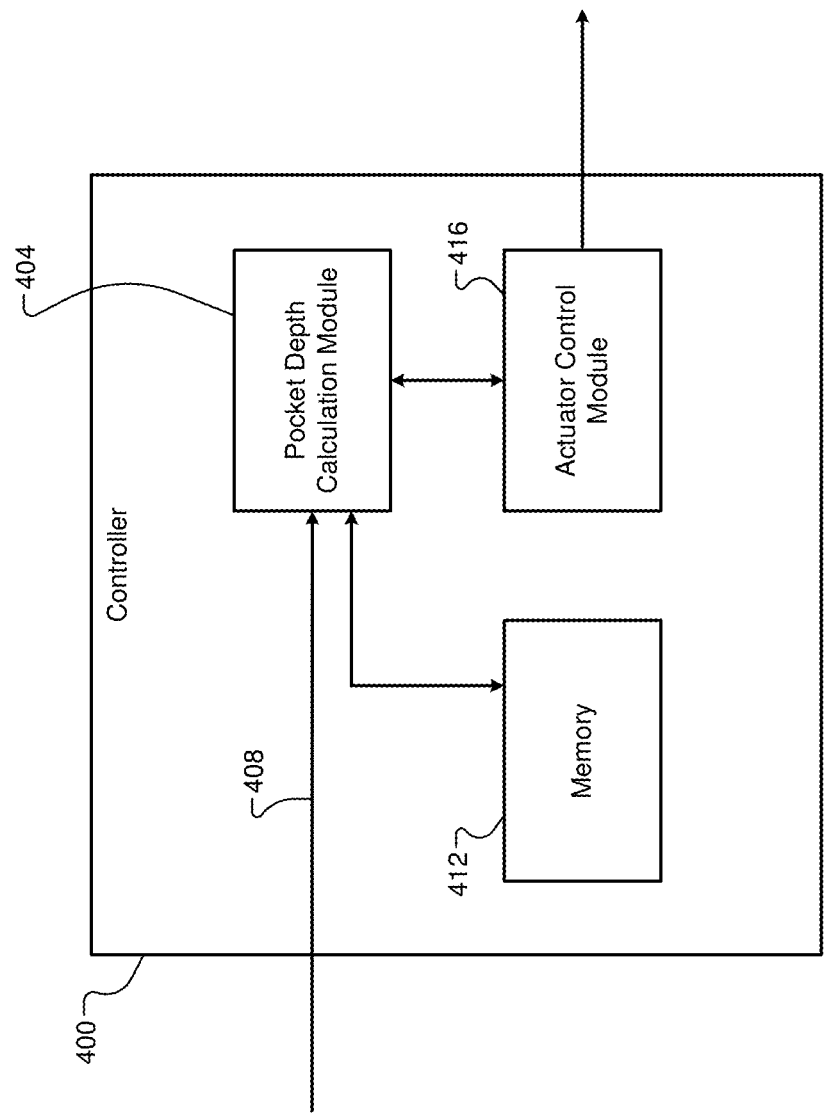
FIG. 9 shows an example controller according to the present disclosure.

Referring now to FIG. 9, an example controller 400 includes a pocket depth calculation module 404 configured to calculate a desired pocket depth d. For example, the pocket depth calculation module 404 receives one or more inputs 408 including, but not limited to, a selected recipe or process, recipe materials or step materials, temperatures, chamber characteristics, user defined variables, a thickness of the substrate being processed, a desired gas velocity profile, desired etch uniformity, and/or other user inputs, sensor measurements, etc. The pocket depth calculation module 404 calculates the desired pocket depth d based on the received inputs 408. For example, the pocket depth calculation module 404 may calculate the desired pocket depth d according to data indicative of predetermined and/or programmed relationships between parameters corresponding to the inputs 408 and the desired pocket depth d. For example only, the data may be stored in and/or retrieved from memory 412. The data may include, but is not limited to, one or more lookup tables, a model to be executed by the pocket depth calculation module 404, etc.

The pocket depth calculation module 404 provides the calculated pocket depth d to an actuator control module 416. The actuator control module 416 outputs one or more control signals based on the calculated pocket depth d to control respective actuators. For example, the control signals may be provided to actuators such as the actuators 220 described in FIGS. 4-7.

Figure 10:
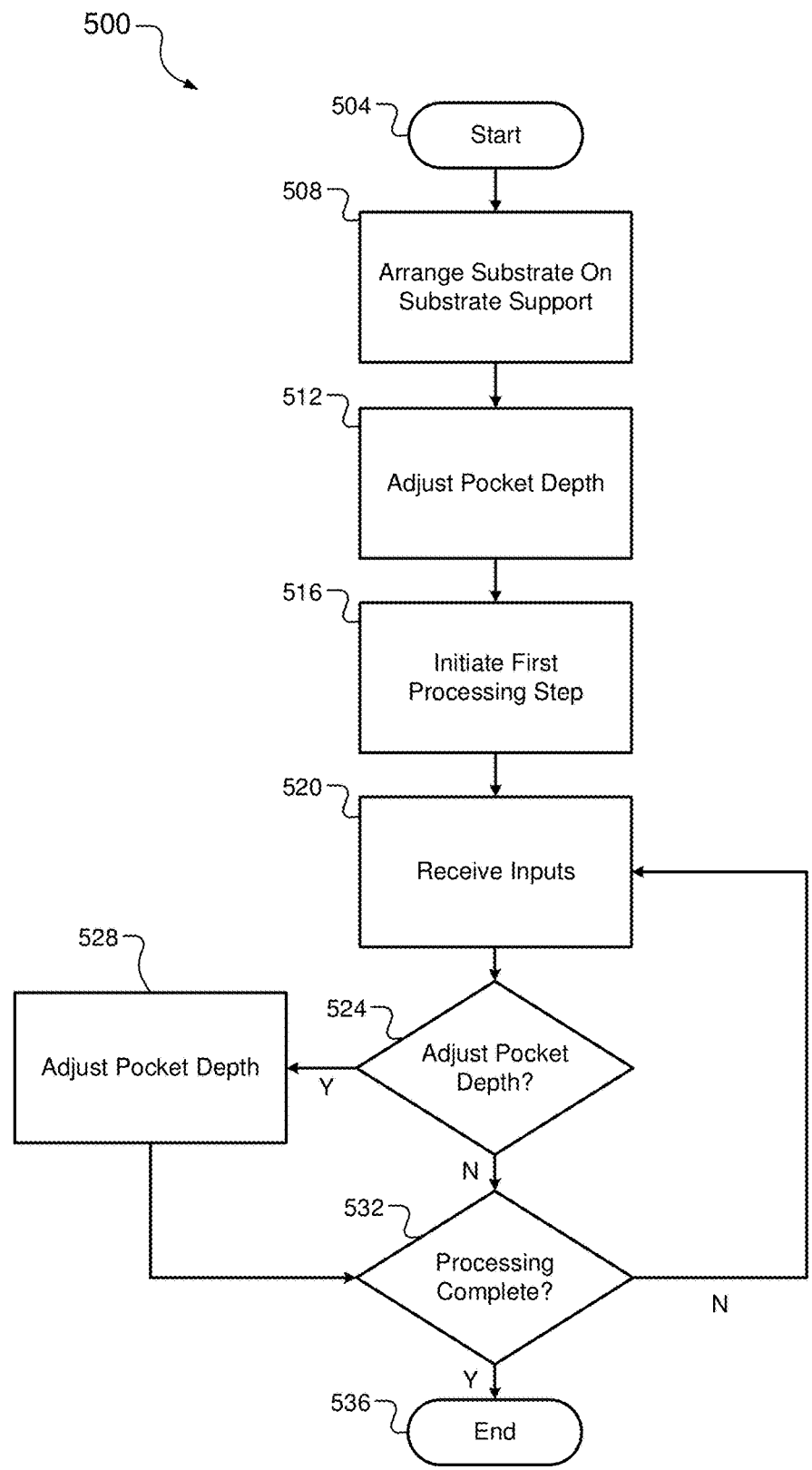
FIG. 10 shows an example method for varying pocket depth according to the present disclosure.

Referring now to FIG. 10, an example method 500 for varying pocket depth according to the present disclosure begins at 504. At 508, a substrate may be arranged on a substrate support for processing. The substrate support may have an initial pocket depth d. The initial pocket depth d may correspond to a default pocket depth (i.e., a predetermined pocket depth), such as a pocket depth that facilitates loading of the substrate onto the substrate support.

At 512, the method 500 (e.g., the controller 400, via the actuators 220) adjusts the pocket depth of the substrate support to a first pocket depth according to a first set of parameters. For example, the first set of parameters may correspond to a first processing step of a selected recipe or process to be performed on the substrate. At 512, the method 516 initiates processing of the substrate. At 520, the method 500 (e.g., the controller 400) receives one or more inputs associated with the pocket depth, including inputs that may vary during processing, such as initiation of a different processing step, temperatures, pressures, gas velocities, chamber chemistry, sensor measurements, and/or other chamber characteristics. At 524, the method 500 (e.g., the controller 400) determines whether to adjust the pocket depth based on the received inputs. If true, the method 500 continues to 528 to adjust the pocket depth (e.g., using the controller 400). If false, the method 500 continues to 532.

At 532, the method 500 (e.g., the controller 400) determines whether processing of the substrate is complete. If true, the method 500 ends at 536. If false, the method 500 continues to 520. Accordingly, the method 500 may continue to adjust the pocket depth of the substrate support during processing of the substrate in response to received inputs indicative of processing parameters.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method of operating a substrate support, the method comprising:
   arranging a substrate on an inner portion of the substrate support;
   calculating a desired pocket depth of the substrate support using data indicative of a relationship between the desired pocket depth and at least one process parameter, wherein the desired pocket depth corresponds to a desired distance between an upper surface of an edge ring surrounding the inner portion and an upper surface of the substrate; and
   selectively controlling an actuator to raise and lower at least one of the edge ring and the inner portion to adjust the distance between the upper surface of the edge ring and the upper surface of the substrate to the calculated desired pocket depth.

2. The method of claim 1, wherein the edge ring is arranged on an outer portion of the substrate support and, wherein raising and lowering the edge ring includes controlling the actuator to raise and lower the outer portion.

3. The method of claim 1, wherein the edge ring includes an inner ring portion that is moveable independently of the edge ring.

4. The method of claim 1, wherein the inner portion corresponds to an electrostatic chuck.

5. The method of claim 1, wherein raising and lowering the at least one of the edge ring and the inner portion includes using one or more actuator pins.

6. The method of claim 1, wherein calculating the desired pocket depth includes calculating the desired pocket depth based on the at least one process parameter, wherein the at least one process parameter includes at least one of (i) a selected recipe or process to be performed on the substrate (ii), characteristics of a processing chamber, (iii) a thickness of the substrate, (iv) a desired gas velocity profile, and (v) a desired etch uniformity.

7. The method of claim 6, further comprising receiving at least one input indicative of the at least one process parameter and calculating the desired pocket depth based on the input.

8. The method of claim 7, further comprising storing, in memory, the data indicative of the relationship between the at least one process parameter and the desired pocket depth.

9. The method of claim 8, further comprising retrieving the data from the memory based on the input and calculating the desired pocket depth based on the retrieved data.

10. The method of claim 9, further comprising calculating the desired pocket depth further based on at least one of a model and a lookup table stored in the memory.

* * * * *